United States Patent
Bandiera

(10) Patent No.: US 9,995,798 B2
(45) Date of Patent: Jun. 12, 2018

(54) MLU BASED MAGNETIC SENSOR HAVING IMPROVED PROGRAMMABILITY AND SENSITIVITY

(71) Applicant: CROCUS Technology SA, Grenoble (FR)

(72) Inventor: Sebastien Bandiera

(*) Notice: Subject to any disclaimer, the term of this patent is extended or adjusted under 35 U.S.C. 154(b) by 0 days. days.

(21) Appl. No.: 15/543,614

(22) PCT Filed: Dec. 23, 2015

(86) PCT No.: PCT/IB2015/059917
§ 371 (c)(1),
(2) Date: Jul. 14, 2017

(87) PCT Pub. No.: WO2016/113618
PCT Pub. Date: Jul. 21, 2016

(65) Prior Publication Data
US 2018/0003781 A1    Jan. 4, 2018

(30) Foreign Application Priority Data
Jan. 16, 2015 (EP) .................................... 15290013

(51) Int. Cl.
*G01R 33/09* (2006.01)
*G11C 11/16* (2006.01)
*H01F 10/32* (2006.01)

(52) U.S. Cl.
CPC .......... *G01R 33/098* (2013.01); *G11C 11/161* (2013.01); *G11C 11/1673* (2013.01); *G11C 11/1675* (2013.01); *H01F 10/3254* (2013.01)

(58) Field of Classification Search
CPC .............. G01R 33/098; G11C 11/1673; G11C 11/1675
See application file for complete search history.

(56) References Cited

U.S. PATENT DOCUMENTS

2002/0117727 A1   8/2002  Engel et al.
2008/0164502 A1*  7/2008  Fukumoto ............. H01L 27/222
                                                          257/295
(Continued)

OTHER PUBLICATIONS

International Search Report for PCT/IB2015/059917 dated Feb. 25, 2016.
Written Opinion for PCT/IB2015/059917 dated Feb. 25, 2016.

*Primary Examiner* — Hoai V Ho
*Assistant Examiner* — Jay Radke
(74) *Attorney, Agent, or Firm* — Pearne & Gordon LLP

(57) ABSTRACT

A magnetic sensor device for sensing an external magnetic field includes a plurality of MLU cells, each MLU cell having a magnetic tunnel junction including a sense layer having a sense magnetization freely orientable in the external magnetic field, a storage layer having a storage magnetization; and a tunnel barrier layer between the sense layer and the storage layer. The magnetic sensor device includes a stress inducing device configured for applying an anisotropic mechanical stress on the magnetic tunnel junction such as to induce a stress-induced magnetic anisotropy on at least one of the sense layer and the storage layer. The stress-induced magnetic anisotropy induced by the stress inducing device corresponds substantially to a net magnetic anisotropy of the at least one of the sense layer and the storage layer. The magnetic sensor device can be programmed easily and has improved sensitivity.

14 Claims, 6 Drawing Sheets

(56) References Cited

U.S. PATENT DOCUMENTS

2010/0080048 A1   4/2010  Liu et al.
2012/0075922 A1   3/2012  Yamada et al.
2014/0206104 A1*  7/2014  Zhu ..................... G11C 11/16
                                                438/3

* cited by examiner

MLU BASED MAGNETIC SENSOR HAVING IMPROVED PROGRAMMABILITY AND SENSITIVITY

FIELD

The present invention concerns a magnetic logic unit (MLU)-based magnetic sensor device for sensing an external magnetic field that can be easily programmed and that yield a linear signal when sensing the external magnetic field. The present disclosure further concerns a method for programming the magnetic sensor device.

DESCRIPTION OF RELATED ART

Magnetic logic unit (MLU) cells can be used to sense magnetic fields, in magnetic sensors or compasses. A MLU cell can comprise a magnetic tunnel junction including a storage layer having a storage magnetization, a sense layer having a sense magnetization and a tunnel barrier layer between the storage and sense layers. The sense magnetization is orientable in the presence of the external magnetic field while the storage magnetization remains substantially undisturbed by the external magnetic field. The external magnetic field can thus be sensed by measuring a resistance of the magnetic tunnel junction that depends on the relative orientation of the sense magnetization, oriented by the external magnetic field, and the storage magnetization.

Ideally, the sense layer has a linear and non-hysteretic behavior when oriented by the external magnetic field in order to facilitate the measurement of small variations of the external magnetic field. That is relevant when sensing the earth's magnetic field having an average value on the order of 0.5 Oersted (Oe).

Such linear and non-hysteretic behavior can be achieved by providing a magnetic tunnel junction where the sense magnetization magnetic anisotropy axis is oriented substantially perpendicular to the storage magnetization. This is usually achieved by pinning the storage magnetization perpendicular to an anisotropy axis of the sense layer. The orientation of the anisotropy axis of the sense layer can be defined by fabrication conditions, for example by applying a magnetic field, during the manufacturing of the magnetic tunnel junction.

A drawback of the above MLU cell is that only one direction of anisotropy can be defined by the sputter conditions on a wafer comprising a plurality of MRAM cells. The sense layer magnetization 210 can thus be oriented perpendicular to the storage magnetization 230 in only one direction in the plane of the sensor device.

FIG. 3 illustrates a conventional MLU-based magnetic sensor device 100 including a plurality of MLU cells electrically connected in series to a current line 3. A magnetic sensor usually requires at least two directions of sensing. FIG. 1 shows a conventional MLU cell comprising a magnetic tunnel junction 2 including a sense layer 21 having a sense magnetization 210, a storage layer 23 having a storage magnetization 230, a storage antiferromagnetic layer 24 pinning the storage magnetization 230 at a low threshold temperature and freeing it at a high threshold temperature, and a tunnel barrier layer 22. The sense magnetization 210 is configured to be orientable in an external magnetic field such that a resistance of the magnetic tunnel junction 2, determined by the relative orientation of the sense magnetization 210 and storage magnetization 230, is varied.

Referring back to FIG. 3 the plurality of MLU cells is represented by the dotted patterns 101, 102, 103. A field line 4 is configured to generate a magnetic field based on an input (a field current). In particular, the plurality of MLU cells are configured in branches 101, 102, 103, each comprising a subset of MLU cells. These branches are oriented at angles of about 0°, about 45°, about 90°, relative to an axis x. The field line may include a plurality of portions 401, 402, 403, each disposed adjacent to a corresponding one of the branches 101, 102, 103 of MLU cells, respectively. The field line portions 401, 402, 403 are configured such that a direction of current flow 41 through each of the portions 401, 402, 403 have an angular orientation corresponding to an angular orientation of its corresponding branches 101, 102, 103. As a result, a programming magnetic field 42 is oriented in a direction perpendicular to the respective field line portion 401, 402, 403 and is aligned along a programming direction 260. The intrinsic anisotropy axis of the sense layer magnetization 210, referred as the sense intrinsic anisotropy axis 251 and the intrinsic anisotropy axis 252 of the storage layer magnetization 230, referred as the storage intrinsic anisotropy axis 252 are defined by the sputter and/or annealing conditions. In absence of magnetic field, the sense magnetization 210 is oriented along the sense intrinsic anisotropy axis 251. In FIG. 3, the sense intrinsic anisotropy axis 251 and the storage intrinsic anisotropy axis 252 are oriented perpendicular to the programmed direction 260 in the branches 101 at about 0°, at an angle of about 45° in the subset 102 at about 45°, and substantially parallel to the programming direction 260 in the subset 103 at about 90°.

Another drawback of the conventional MLU-based magnetic sensor device is that during programming the device, i.e., during the step of setting the orientation of the storage magnetization, the storage magnetization 230 can only be aligned in a direction being close to that of the storage intrinsic anisotropy axis 251. As discussed above, the latter is oriented in a single direction in all branches of the magnetic sensor device, the direction being determined by the fabrication process of the magnetic sensor device (sputter conditions, annealing conditions, etc.). The programming of the storage magnetization in a direction that is not close to the anisotropy axis requires a higher programming field than if the programming is performed in a direction that is close to the anisotropy axis. It is not possible in conventional MLU-based magnetic sensor devices to generate a programming magnetic field 42 with the programming line 4 that is large enough to program the storage magnetization 230 in a direction that is not close to the anisotropy axis.

In order to obtain a 2D magnetic sensor device such as the one depicted in FIG. 3, the storage layer 23 in the MLU cells 1 comprised in the different branches should be programmed in different directions and for some of the branches the programming direction 260 will be far from the magnetic anisotropy axis (i.e. there is an angle greater than 10° between the programming direction 260 and the magnetic anisotropy axis), resulting in a poor programming in these branches. The sensitivity of a poorly programmed branch to external magnetic fields is small, usually not large enough to determinate accurately the value of the external magnetic field.

US2012075922 discloses a magnetic memory element capable of maintaining high thermal stability (retention characteristics) while reducing a writing current. The magnetic memory element includes a magnetic tunnel junction having a first magnetic body including a perpendicular magnetization film, an insulating layer, and a second magnetic body serving as a storage layer including a perpendicular magnetization film, which are sequentially stacked.

A thermal expansion layer is disposed in contact with the magnetic tunnel junction portion. The second magnetic body is deformed in a direction in which the cross section thereof increases or decreases by the thermal expansion or contraction of the thermal expansion layer due to the flow of a current, thereby reducing a switching current threshold value required to change the magnetization direction.

US2010080048 discloses a magnetic memory cell including a piezoelectric material, and methods of operating the memory cell are provided. The memory cell includes a stack, and the piezoelectric material may be formed as a layer in the stack or adjacent the layers of the cell stack. The piezoelectric material may be used to induce a transient stress during programming of the memory cell to reduce the critical switching current of the memory cell.

US2002117727 discloses a magnetoelectronics element that comprises a first magnetic layer, a first tunnel barrier layer on the first magnetic layer, a second magnetic layer on the first tunnel barrier layer and a stressed over-layer on said second magnetic layer, which is configured to alter a switching energy barrier of said second magnetic layer.

SUMMARY

The present disclosure concerns a magnetic sensor device for sensing an external magnetic field, comprising a plurality of MLU cells, each MLU cell comprising a magnetic tunnel junction including a sense layer having a sense magnetization freely orientable in the external magnetic field; a storage layer having a storage magnetization; and a tunnel barrier layer between the sense layer and the storage layer; the magnetic sensor device further comprising a stress inducing device configured for applying an anisotropic mechanical stress on the magnetic tunnel junction such as to induce a stress-induced magnetic anisotropy on at least one of the sense layer and the storage layer.

The present disclosure further concerns a method for programming (initializing) the magnetic sensor device, comprising:

using the stress inducing device for inducing a stress-induced magnetic anisotropy on at least one of the sense layer and the storage layer; and aligning the storage magnetization of each of said plurality of MLU cells in a programmed direction.

An advantage of the disclosed magnetic sensor device is that the magnetic anisotropy of the sense and storage layers can be oriented in a specific direction for each branch and each layer, such that the programming as well as the sensitivity of each branch, and thus the magnetic sensor device, will be improved. Indeed, each branch is easier to program due to the net magnetic anisotropy of the storage layer being oriented in a direction close to that of the programmed direction. Since the magnetization of the sense layer is oriented perpendicular to the storage layer magnetization, each branch of the magnetic sensor device presents a linear and non-hysteretic behaviour.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
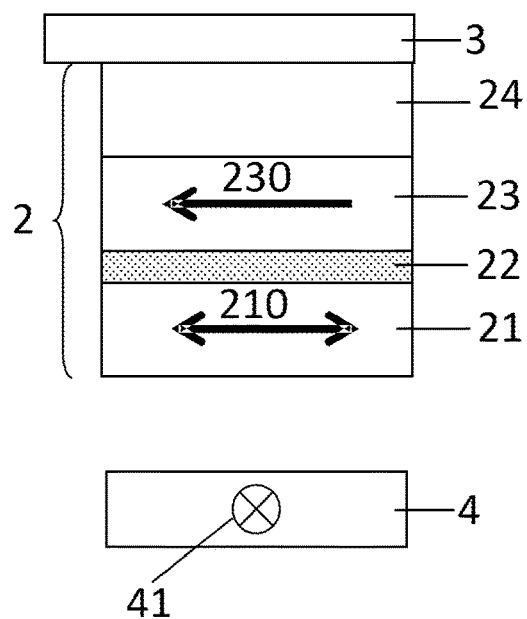
FIG. 1 represents a magnetic tunnel junction comprising a storage layer, a tunnel barrier layer and a sense layer.

Referring to FIG. 1, a MLU cell 1 for sensing an external magnetic field comprises a magnetic tunnel junction 2 including a sense layer 21, a storage layer 23 and a tunnel barrier layer 22 between the sense layer 21 and the storage layer 23. The sense layer 21 has a sense magnetization 210 that is freely orientable in the external magnetic field. The storage layer 23 has a storage magnetization 230 which orientation remains stable in the external magnetic field. The MLU cell 1 can further include traces or strip conductors to provide write and read functionality. Specifically, a current line 3 can be electrically coupled to the MLU cell 1. The MLU cell 1 can include a programming line 4 extending substantially perpendicular (or parallel) to the current line 3 and being magnetically coupled to the MLU cell 1. The MLU cell 1 can further include a selection transistor 8 electrically connected, through a strap 7, to the MLU cell 1.

The sense layer 21 can include a soft ferromagnetic material, namely one having a relatively low magnetic anisotropy, while the storage layer 23 can include a hard ferromagnetic material, namely one having a relatively high coercivity. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or Ni80Fe20); alloys based on Ni, Fe, and boron ("B"); Co90Fe10; and alloys based on Co, Fe, and B. A thickness of each of the sense layer 21 and the storage layer 23 can be in the nm range, such as from about 0.4 nm to about 20 nm or from about 1 nm to about 10 nm.

Figure 2:
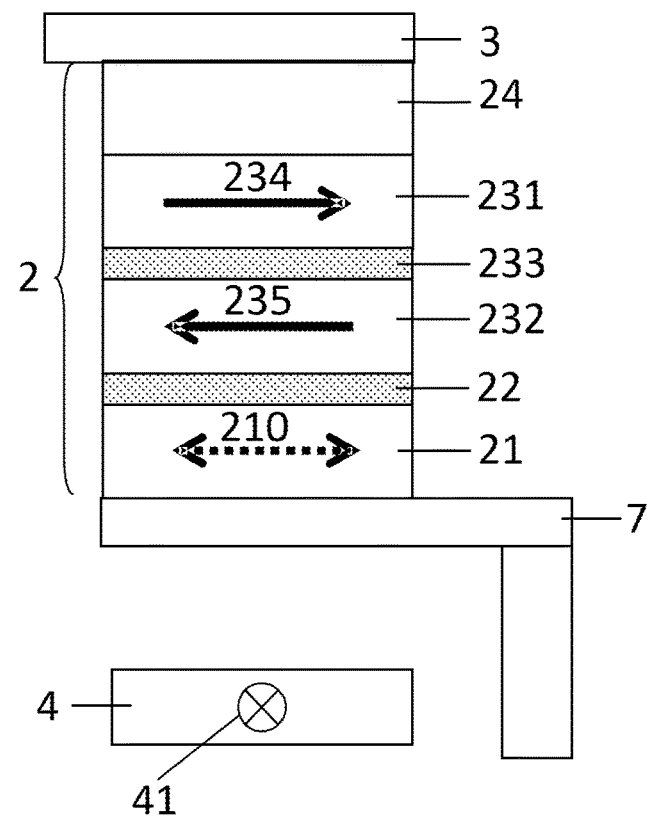
FIG. 2 represents the magnetic tunnel junction of FIG. 1 where the storage layer is a synthetic antiferromagnet comprising a first storage ferromagnetic layer, a second storage ferromagnetic layer and an anti-parallel coupling layer.

Other implementations of the sense layer 21 and the storage layer 23 are contemplated. For example, either, or both, of the sense layer 21 and the storage layer 23 can include multiple sub-layers in a fashion similar to that of the so-called synthetic antiferromagnetic layer. FIG. 2 shows the magnetic tunnel junction 2 where the storage layer 23 includes a synthetic storage layer, or synthetic antiferromagnet (SAF), comprising a first storage ferromagnetic layer 231 having a first storage magnetization 234, and a second storage ferromagnetic layer 232 having a second storage magnetization 235. A storage anti-parallel coupling layer 233 is included between the first and second storage ferromagnetic layers 231, 232. The storage coupling layer 233 produces a RKKY coupling between the first and second storage layers 231, 232 such that the second storage magnetization 235 remains antiparallel to the first storage magnetization 234. The two storage ferromagnetic layers 231, 232 can comprise a CoFe, CoFeB or NiFe alloy and have a thickness typically comprised between about 0.5 nm and about 4 nm. The storage coupling layer 233 can comprise a non-magnetic material selected from a group comprising at least one of: ruthenium, chromium, rhenium, iridium, rhodium, silver, copper and yttrium. Preferably, the storage coupling layer 233 comprises ruthenium and has a thickness typically included between about 0.4 nm and 3 nm, preferably between 0.6 nm and about 0.9 nm or between about 1.6 nm and about 2 nm.

The tunnel barrier layer 22 can include, or can be formed of, an insulating material. Suitable insulating materials include oxides, such as aluminum oxide (e.g., $Al_2O_3$) and magnesium oxide (e.g., MgO). A thickness of the tunnel barrier layer 22 can be in the nm range, such as from about 0.5 nm to about 10 nm.

The MLU cell 1 can be configured to be written, or programmed, by a thermally-assisted switching (TAS) operation. Again referring to FIG. 1, the MLU cell 1 can further include a pinning layer 24, which is disposed adjacent to the storage layer 23 and, through exchange bias, stabilizes, or pin, the storage magnetization 230 along a particular direction when a temperature within, or in the vicinity of, the pinning layer 24 is at a low threshold temperature $T_L$. The low threshold temperature $T_L$ can correspond to a temperature being below a blocking temperature, a Neel temperature, or another threshold temperature. The pinning layer 24 unpins, or decouples, the storage magnetization 230 when the temperature is at high threshold temperature $T_H$, i.e., at a temperature above the blocking temperature, thereby allowing the storage magnetization 230 to be switched to another direction.

As illustrated in FIG. 2, in the case the storage layer has a SAF configuration, the pinning layer 24 can be adjacent to the first storage ferromagnetic layer 231 such as to pin the first storage magnetization 234 at the low threshold temperature $T_L$ and free it at the at high threshold temperature $T_H$. The second storage magnetization 235 is not exchange coupled by the pinning layer 24 but remains anti-parallel coupled to the first storage magnetization 234 through the storage coupling layer 233. The pinning layer 24 could also be adjacent to the second storage ferromagnetic layer 232 such as to exchange couple this layer.

The pinning layer 24 includes, or is formed of, a magnetic material and, in particular, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). In some instances, the blocking temperature of alloys based on Ir and Mn (or based on Fe and Mn) can be in the range of about 90° C. to about 350° C. or about 150° C. to about 200° C., and can be smaller than the blocking temperature of alloys based on Pt and Mn (or based on Ni and Mn), which can be in the range of about 200° C. to about 400° C.

In an embodiment, the MLU cell 1 further comprises a stress inducing device 6 configured for applying an anisotropic mechanical stress on the magnetic tunnel junction 2 such as to induce a stress-induced magnetic anisotropy 270 on at least one of the sense layer 21 and the storage layer 23.

A magnetostrictive material develops large mechanical deformations when subjected to an external magnetic field. This phenomenon is attributed to the rotations of small magnetic domains in the material, which are randomly oriented when the material is not exposed to a magnetic field. The orientation of these small domains by the imposition of the magnetic field creates a strain field. As the intensity of the magnetic field is increased, more and more magnetic domains orientate themselves so that their principal axes of anisotropy are collinear with the magnetic field in each region and finally saturation is achieved. Conversely, the change in magnetization or magnetic anisotropy axis due to applied stress is also known as magnetoelastic effect or Villari effect.

Thus, applying an anisotropic mechanical stress on the magnetic tunnel junction 2 induces an additional magnetic anisotropy source, referred as stress induced magnetic anisotropy. Such anisotropic mechanical stress is generated by the stress inducing device 6. The stress inducing device 6 can comprise metal lines or an oxide located at the vicinity of the magnetic tunnel junction 2. In an embodiment, the stress inducing device 6 comprises the current line 3 and/or the programming line 4. Alternatively, or in combination, the stress inducing device 6 can comprise an additional metallic line, such as the strap 7, or any other metallic line adapted for generating an appropriate mechanical stress. Alternatively, or in combination, the stress inducing device 6 can comprise an encapsulation layer (not shown), such as a dielectric layer encapsulating the MLU cell 1.

The stress inducing device is further configured such that the stress-induced magnetic anisotropy 270 has a larger magnitude that any other possible contributions of magnetic anisotropy, (thereafter referred as sense intrinsic anisotropy 251 for the sense layer 21 and storage intrinsic anisotropy 252 for the storage layer 23 in the following text) such as magnetic anisotropy induced by deposition and or annealing, shape or crystalline anisotropy. The stress-induced magnetic anisotropy in the sense layer 21 will be referred as sense stress-induced magnetic anisotropy 271, and the stress-induced magnetic anisotropy in the storage layer 23 will be referred as storage stress-induced magnetic anisotropy 272. The stress inducing device 6 is thus configured such that the sense stress-induced magnetic anisotropy 271 corresponds substantially to a net sense magnetic anisotropy 281, and the storage stress-induced magnetic anisotropy 272 corresponds substantially to a net storage magnetic anisotropy 282 (see FIG. 4). Here, the net sense magnetic anisotropy 281 corresponds to the sum of the sense intrinsic anisotropy 251 and the sense stress-induced magnetic anisotropy 271 and the net storage magnetic anisotropy 282 corresponds to the sum of the storage intrinsic anisotropy 252 and the storage stress-induced magnetic anisotropy 272. In other words, the sense intrinsic anisotropy 251 can be neglected compared to the sense stress-induced magnetic anisotropy 271 and the storage intrinsic anisotropy 252 can be neglected compared to the storage stress-induced magnetic anisotropy 272.

Figure 3:
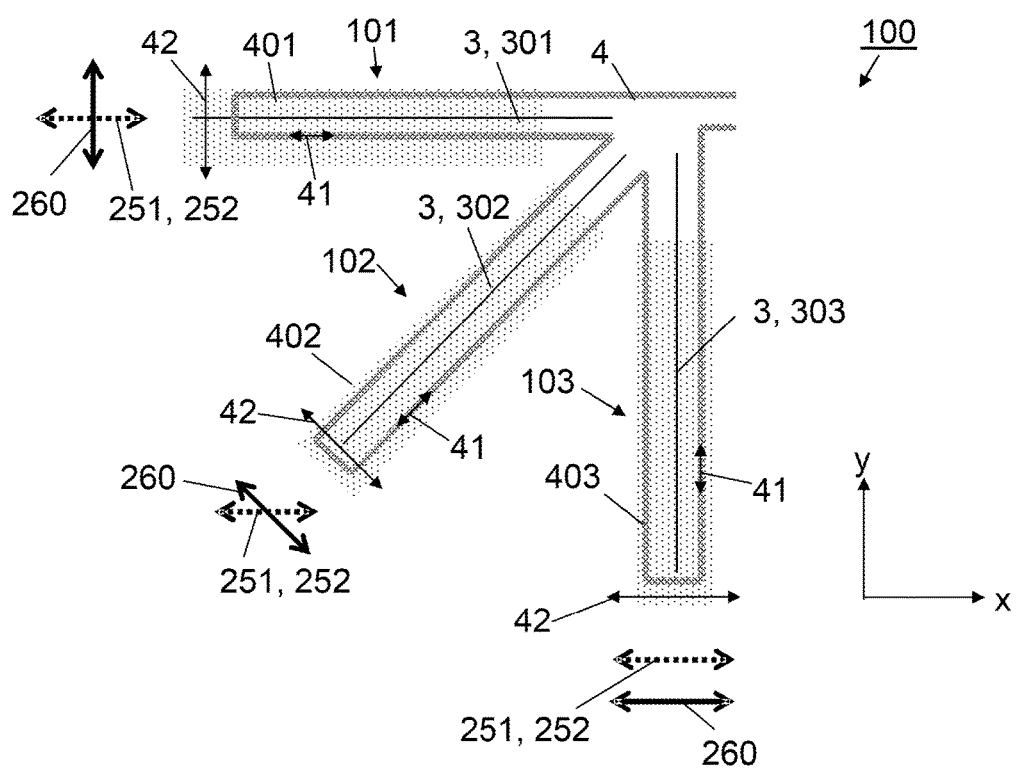
FIG. 3 illustrates a conventional MLU-based magnetic sensor comprising a first, second and third branch comprising MLU cells.
Figure 4:
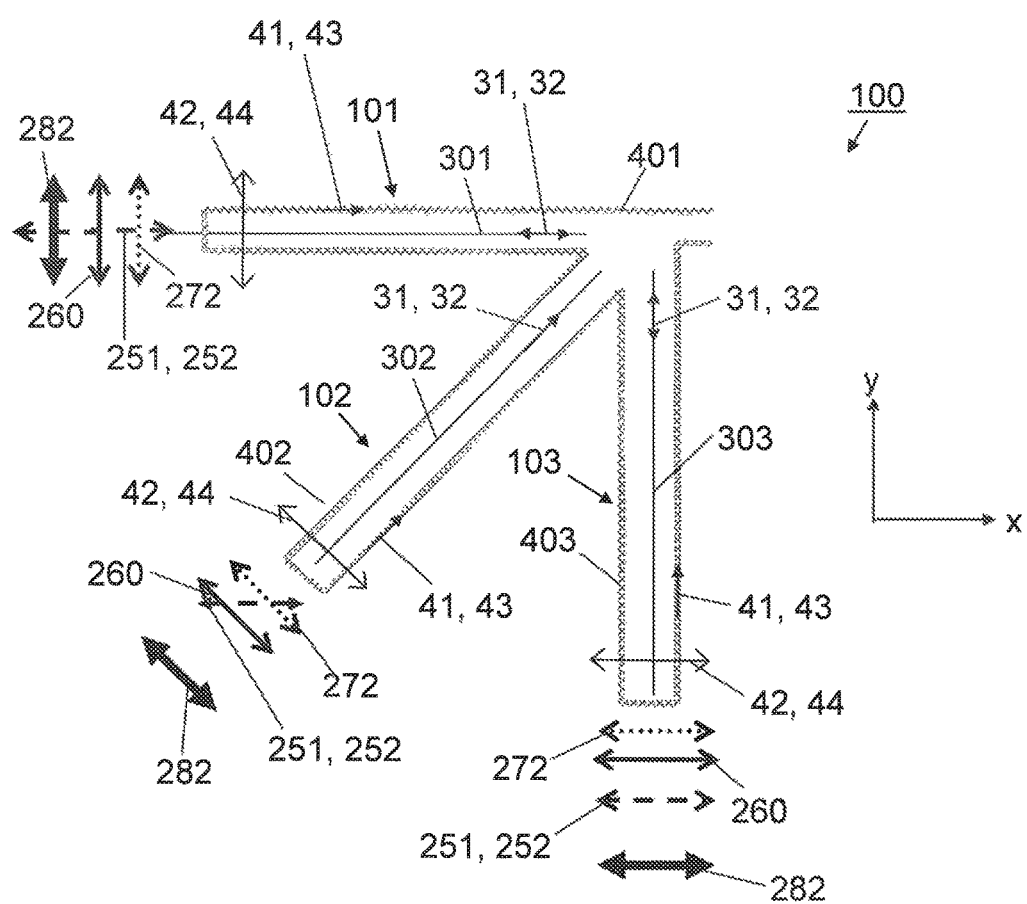
FIG. 4 illustrates a MLU-based magnetic field direction measurement device, according to an embodiment.
Figures 5A, 5B, 5C, 5D:
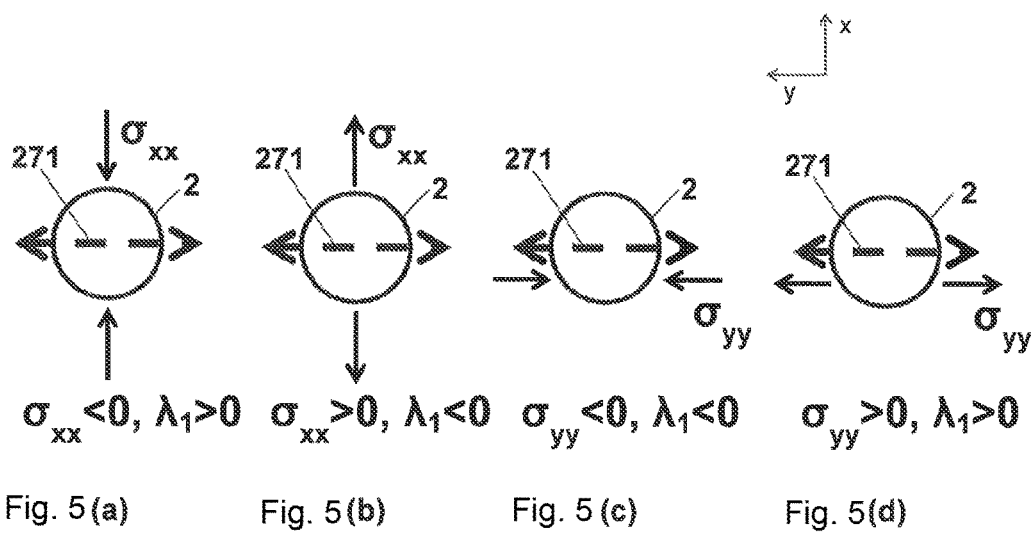
FIGS. 5a to 5d illustrate four possible ways to induce a stress-induced magnetic anisotropy in the y direction by using the stress inducing device.

FIG. 4 illustrates an example of a magnetic sensor device 100 for measuring a magnetic field direction, according to an embodiment. The magnetic sensor device 100 includes a plurality of the MLU cells 1. The configuration of the magnetic sensor device 100 of FIG. 4 is similar to the one described in FIG. 3. The magnetic sensor device 100 comprises a plurality of branches 101, 102, 103 wherein each branch comprises a subset of the plurality of MLU cells 1 electrically connected in series to a current portion 301, 302, 303 of the current line 3, respectively. The magnetic sensor device 100 further comprises a programming line 4 configured for passing a programming field current 41 for inducing a programming magnetic field 42. The programming line comprises programming line portions 401, 402, 403, each programming line portions addressing a corresponding branch 101, 102, 103, respectively.

More particularly, each branch 101, 102, 103 includes an array comprising one or more rows and/or and columns of said plurality of MLU cells 1, electrically connected in series to one of the current lines 301, 302, 303. For example, each branch 101, 102, 103 can comprise one row of MLU cells 1 or two or more adjacent rows of MLU cells 1. The programming field current 41 can be passed individually in each programming line portion 401, 402, 403. Alternatively, the programming line portions 401, 402, 403 can be electrically connected in series such that the programming field current 41 is simultaneously passed in the programming line portions 401, 402, 403.

In the arrangement of FIG. 4, the magnetic sensor device 100 is represented having a first branch 101 oriented at angle of about 0° with respect to an axis x, a second branch 102 oriented at angle of about 45° and a third branch 103 oriented at angle of about 90° with respect to the axis x. A MLU cells comprised in the first, second and third branch 101, 102, 103 are addressed by a first, second and third programming line portion 401, 402, 403, respectively. The first, second and third programming line portions 401, 402, 403 are electrically connected in series such as to form a single programming line 4 in which the programming current 41 is passed.

The programming line portions 401, 402, 403 are configured such that the programming field current 41 flowing in any of the programming line portion 401, 402, 403 induce the programming magnetic field 42 in a direction that is substantially perpendicular to the programming line portion 401, 402, 403 and to the branch 101, 102, 103.

Other configurations of the magnetic sensor device 100 can be contemplated. For example, the magnetic sensor device 100 can comprise a plurality of branches such that the average storage magnetization directions 230 of the MLU cells 1 substantially equally spaced by an angle of about 360 degrees divided by "n", where "n" can be 8, or about 45°.

According to an embodiment, a method for programming the magnetic sensor device 100, comprises the steps of:

using the stress inducing device 6 for inducing a storage stress-induced magnetic anisotropy 272 on the storage layer 23 such that the storage stress-induced magnetic anisotropy 272 of the storage layer 23 is substantially parallel to the programming magnetic field 42; and aligning the storage magnetization 230 of the MLU cells 1 comprised in each subset in a programmed direction 260 (see FIG. 4) that is substantially parallel to the programming magnetic field 42.

The storage magnetization 230 can be aligned in the programmed direction 260 by applying a programming magnetic field 42 in the field line 401, 402, 403.

Inducing a storage stress-induced magnetic anisotropy 272 and/or a sense stress-induced magnetic anisotropy 271 can be performed by inducing a mechanical stress on the storage layer 23 and/or the sense layer 21. The mechanical stress can be induced by adapting the shape, the material properties and the fabrication conditions of the current line 3, the field line 4, the strap 7, or any other metallic line adapted for generating an appropriate mechanical stress. Alternatively, or in combination, the mechanical stress can be induced by adapting the material properties and the fabrication conditions of insulating materials located at the vicinity the magnetic tunnel junction 2, such as a dielectric layer encapsulating the MLU cell 1.

In an embodiment, the stress inducing device 6 can be configured such that the direction of the sense stress induced magnetic anisotropy 271 is different for each of said plurality of branches 101, 102, 103. This can be achieved by orienting the current lines 301, 302, 303, or the field lines 401, 402, 403, the strap 7, or any other metallic line adapted for generating an appropriate mechanical stress, or insulating layer in the appropriate direction in each branch.

During the programming operation, the storage magnetization 230 of the MLU cells 1 comprised in each branch 101, 102, 103 can be aligned in a programmed direction 260 that is substantially parallel to the programming magnetic field 42. Thus, the programmed direction 260 of the storage magnetization 230 can be substantially parallel to the stress-induced magnetic anisotropy 272 of the storage layer 23 of the MLU cells 1 comprised in each branch 101, 102, 103. FIG. 4 also reports the orientation of the storage intrinsic anisotropy 251 for comparison.

In an embodiment, a direction of the sense stress-induced magnetic anisotropy 271 in the sense layer 21 and/or a direction of the storage stress-induced magnetic anisotropy 272 in the storage layer 23 can be adjusted by adjusting the amplitude of the applied anisotropic mechanical stress.

In another embodiment, the strength and the direction of the anisotropic mechanical stress is modified by adjusting at least one of the deposition conditions of the current line 3, 301, 302, 303, or the field line 4, 401, 402, 403, or the strap 7, or any other metallic line adapted for generating an appropriate mechanical stress, or insulating layers lying at the MLU cell 1 vicinity. The strength and the direction of the anisotropic mechanical stress can be further adjusted by a selection of a combination of materials having different thermal expansion coefficient for the metal and/or insulating materials forming the electrically stress-inducing device 6.

In an embodiment, the anisotropic mechanical stress applied by the stress inducing device 6 is between about 1 MPa to 5 GPa.

The direction of the sense stress-induced magnetic anisotropy 271 in the sense layer 21 can be adjusted by modifying a sense magnetoelastic coupling constant $\lambda_1$ of the sense layer 21. The direction of the storage stress-induced magnetic anisotropy 272 in the storage layer 23 can also be adjusted by modifying a storage magnetoelastic coupling constant $\lambda_2$ of the storage layer 23.

In an embodiment, the sense magnetoelastic coupling constant $\lambda_1$ and the storage magnetoelastic coupling constant $\lambda_2$ have opposed signs. Applying the anisotropic mechanical stress thus results in the sense stress-induced magnetic anisotropy 271 of the sense layer 21 being oriented substantially perpendicular to the storage stress-induced magnetic anisotropy 272 of the storage layer 23. In a particular arrangement, the sense magnetoelastic coupling constant $\lambda_1$ and the storage magnetoelastic coupling constant $\lambda_2$ is in the range between about −1000 ppm and about 1000 ppm.

FIGS. 5a to 5d represent four possible ways to induce the sense stress-induced magnetic anisotropy 271 in the y direction by using the stress inducing device 6. In FIGS. 5a to 5d, the magnetic tunnel junction, or sense layer 21, is represented schematically viewed from the top. For a positive sense magnetoelastic coupling constant $\lambda_1$, the sense stress-induced magnetic anisotropy 271 induced by stress σ is perpendicular to the stress direction for compressive stress ($\sigma_{xx} > 0$, see FIG. 5a), and parallel to the stress direction for tensile stress ($\sigma_{yy} > 0$, see FIG. 5d). For a negative sense magnetoelastic coupling constant $\lambda_1$, the sense stress-induced magnetic anisotropy 271 is perpendicular to the stress direction for tensile stress ($\sigma_{xx}$>0, see FIG. 5b), or parallel to the stress direction for compressive stress ($\sigma_{yy}$<0, see FIG. 5c).

Figure 6:
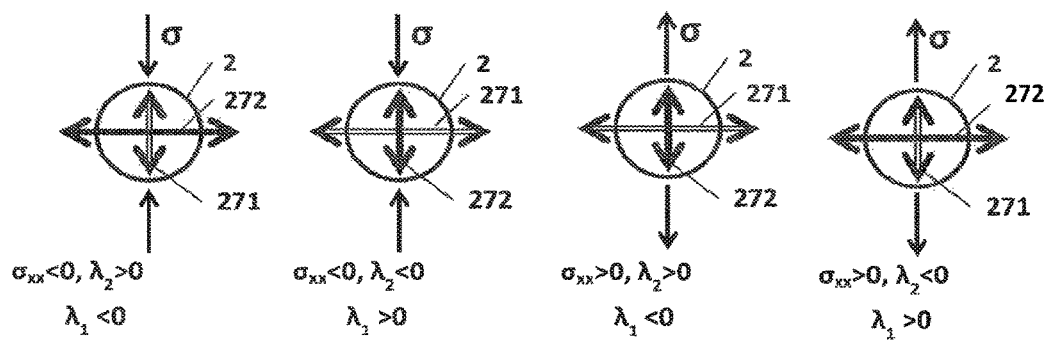
FIGS. 6a to 6d represent four possible ways to induce a stress-induced magnetic anisotropy in the sense layer that is substantially perpendicular to the stress-induced magnetic anisotropy in the storage layer by using the stress inducing device.

FIGS. 6a to 6d represent four possible ways to induce a sense stress-induced magnetic anisotropy 271 in the sense layer 21 that is substantially perpendicular to the storage stress-induced magnetic anisotropy 272 in the storage layer 23 by using the stress inducing device 6. In FIGS. 6a to 6d, the magnetic tunnel junction 2, is represented schematically viewed from the top. This can be achieved by any combination of direction and sign of stress σ, provided the sense magnetoelastic coupling constant $\lambda_1$ and the storage magnetoelastic coupling constant $\lambda_2$ have opposed signs. In the example of FIGS. 6a to 6d, a sense stress-induced magnetic anisotropy 271 in the sense layer 21 that is substantially perpendicular to the storage stress-induced magnetic anisotropy 272 in the storage layer 23 is achieved by applying a compressive stress ($\sigma_{xx}$<0) with the sense magnetoelastic coupling constant $\lambda_1$ being negative (<0) and the storage magnetoelastic coupling constant $\lambda_2$ being positive (>0) (FIG. 6a). This is also achieved by applying a compressive stress ($\sigma_{xx}$<0) with $\lambda_1$>0 and $\lambda_2$<0 (FIG. 6b); or by applying a tensile stress ($\sigma_{xx}$>0) with $\|_1$<0 and $\lambda_2$>0 (FIG. 6c); and by applying a tensile stress ($\sigma_{xx}$>0) with $\lambda_1$>0 and $\lambda_2$<0 (FIG. 6d).

The stress inducing device 6 is thus capable of applying an anisotropic mechanical stress inducing the sense and storage stress-induced magnetic anisotropy 271, 272 on the sense layer 21 and the storage layer 23, respectively, with the sense stress-induced magnetic anisotropy 271 of the sense layer 21 having a direction that differs from a direction of the storage stress-induced magnetic anisotropy 272 of the storage layer 23.

Figure 7:
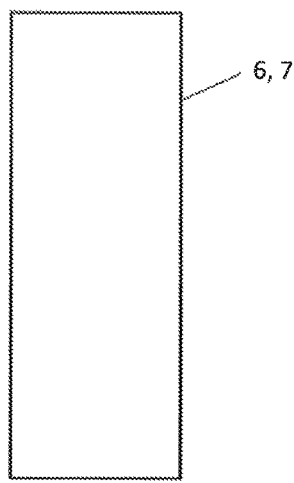
FIGS. 7a and 7b represent a way to induce anisotropic stress in the sense layer and the storage layer thanks to a metal line having an appropriate shape and deposited at high temperature.
Figure 7:
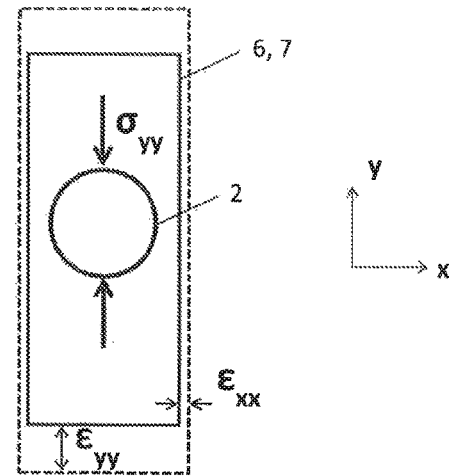

FIGS. 7a and 7b represent a way to induce anisotropic stress in the sense layer 21 and the storage layer 23 thanks to a metal line 7 having an appropriate shape and deposited at high temperature. In FIGS. 7a and 7b, the magnetic tunnel junction 2 and the stress-inducing device 6 are represented schematically viewed from the top. In the present example, the stress-inducing device 6 comprises a metal line 7 having a rectangular shape (the longer dimension is along the y axis in that example). The metal line 7 is deposited at a temperature higher than the operating temperature of the sensor device (FIG. 7a). The operating temperature can vary between 0° C. and 85° C., possibly between −40° C. a 180° C. and possibly up to 250° C. The deposition temperature can be between 150° C. and 400° C. and possibly between 20° C. and 800° C. The metal line 7 cools after processing down to the operating temperature of the device. As it can be seen in FIG. 7b, the metal line 7 retracts due to the thermal retraction of the metal line 7 (the rectangle in dotted line show the dimensions of the line 7 prior to the cooling. Since the metal line 7 has a larger length (in y) than in width (in x), the retraction is anisotropic. In other words, the deformation $\varepsilon_{xx}$ in the x direction is smaller than the deformation $\varepsilon_{yy}$ in the y direction. The anisotropic retraction induces an anisotropic compressive stress in the y direction on the magnetic tunnel junction 2 that is deposited above the metal line 7.

In the case of a TAS-based programming operation, the method can further comprise the step of passing a heating current 31 in the current line 301, 302, 303 such as to heat the MLU cells 1 in the corresponding subset 101, 102, 103 at the high threshold temperature $T_H$ and unpin the storage magnetization 230 of said MLU cells 1. After, or simultaneously with the step of aligning the storage magnetization 230 in the programmed direction 260, the method can comprise the step of cooling the MLU cells 1 comprised in the corresponding subset 101, 102, 103 to the low threshold temperature $T_L$ such as to pin the switching the storage magnetization 230 in the programmed direction 260.

A sensing operation of the magnetic sensor device 100 comprises passing a sensing current 32 in the current branches 301, 302, 303 such as to measure an average resistance R. Here, the average resistance R corresponds to the resistance measured in series for the MLU cells comprised in a branch 101, 102, 103. The resistance of each MLU cell is determined by the relative orientation of the sense magnetization 210 with respect to the storage magnetization 230. The sense magnetization 210 can be varied by passing a sense field current 43 in the programming line portions 401, 402, 403 such as to generate a sense magnetic field 44. The sense field current 43 can be alternated such as to modulate the sense magnetic field 44 and the average resistance R in accordance with the polarity of the sense field current 43. Since the sense stress-induced magnetic anisotropy 271 (or sense net magnetic anisotropy 281) is initially substantially perpendicular to the storage stress-induced magnetic anisotropy 272 (or storage net magnetic anisotropy 282), the response will be linear.

When the magnetic sensor device 100 is used for sensing an external magnetic field, such as the earth magnetic field, the sense magnetization 210 is aligned in the external magnetic field in accordance with the respective orientation of the external magnetic field and of the orientation of the branches 101, 102, 103 with respect to the direction of the external magnetic field. The external magnetic field can be determined by passing a sensing current 32 in the current branches 301, 302, 303 such as to measure an average resistance R by passing the sensing current 32 in the current branches 301, 302, 303.

The MLU-based magnetic sensor device 100 disclosed herein may be included in, for example, a magnetometer and/or a compass.

In one embodiment, the magnetic sensor device 100 can be used for measuring a direction of an external magnetic field, such as the Earth's magnetic field, in two dimensions, e.g. a component of the external magnetic field in a two-dimensional plane. Devices incorporating design principles of the magnetic sensor device 100 may also measure a direction of the external magnetic field in three dimensions, such as by using the magnetic sensor device 100 with Hall effect vertical axis sensing. The Hall effect can result in a voltage difference (the Hall voltage) across an electrical conductor, transverse to an electric current in the conductor and a magnetic field perpendicular to the current. Based on the Hall effect, a component of the external magnetic field in the third dimension may be determined.

REFERENCE NUMBERS AND SYMBOLS

1 MLU cell
100 magnetic sensor device
101 first subset, first branch
102 second subset, second branch
103 third subset, third branch
2 magnetic tunnel junction
21 sense layer
210 sense magnetization
22 tunnel barrier layer
23 storage layer
230 storage magnetization 231 first storage ferromagnetic layer
232 second storage ferromagnetic layer
233 storage coupling layer
234 first storage magnetization
235 second storage magnetization
24 pinning layer
251 sense intrinsic anisotropy
252 storage intrinsic anisotropy
260 programmed direction
271 sense stress-induced magnetic anisotropy
272 storage stress-induced magnetic anisotropy
281 sense net magnetic anisotropy
282 storage net magnetic anisotropy
current line
301 first current branch
302 second current branch
303 third current branch
31 heating current
32 sense current
4 programming line
401 programming line portion
402 programming line portion
403 programming line portion
41 programming field current
42 programming magnetic field
43 sense field current
44 sense magnetic field
6 stress-inducing device
7 additional metal line
$\lambda_1$ sense magnetoelastic coupling constant
$\lambda_2$ storage magnetoelastic coupling constant
σ stress
ε deformation
$\sigma_{xx}$ stress in the x direction
$\sigma_{yy}$ stress in the y direction
$\varepsilon_{xx}$ deformation in the x direction
$\varepsilon_{yy}$ deformation in the y direction
R average resistance
$T_H$ high threshold temperature
$T_L$ low threshold temperature

What is claimed is:

1. A magnetic sensor device for sensing an external magnetic field, comprising a plurality of magnetic logic unit MLU cells, each MLU cell comprising a magnetic tunnel junction including a sense layer having a sense magnetization freely orientable in the external magnetic field, a storage layer having a storage magnetization, a tunnel barrier layer between the sense layer and the storage layer; and a stress inducing device configured for applying an anisotropic mechanical stress on the magnetic tunnel junction such as to induce a stress-induced magnetic anisotropy in the sense layer and the storage layer;

wherein said stress-induced magnetic anisotropy corresponds substantially to a net magnetic anisotropy of the sense layer and the storage layer; and wherein the stress inducing device is further configured such that the applied anisotropic mechanical stress induces the stress-induced magnetic anisotropy in the sense and storage layers, such that a direction of the sense stress-induced magnetic anisotropy of the sense layer differs from a direction of the storage stress-induced magnetic anisotropy of the storage layer.

2. The magnetic sensor device according to claim 1, wherein the respective directions of the stress-induced magnetic anisotropy of the sense and storage layers is adjustable by adjusting the amplitude of the applied anisotropic mechanical stress.

3. The magnetic sensor device according to claim 1,
wherein the direction of a sense stress-induced magnetic anisotropy of the sense layer is adjustable by adjusting a sense magnetoelastic coupling constant of the sense layer and
wherein the direction of a storage stress-induced magnetic anisotropy of the storage layer is adjustable by adjusting a storage magnetoelastic coupling constant of the storage layer.

4. The magnetic sensor device according to claim 3, wherein the sense magnetoelastic coupling constant has a sign being opposed to the one of the storage magnetoelastic coupling constant, such that, when the anisotropic mechanical stress is applied, the sense stress-induced magnetic anisotropy of the sense layer is oriented substantially perpendicular to the storage stress-induced magnetic anisotropy of the storage layer.

5. The magnetic sensor device according to claim 3, wherein the sense magnetoelastic coupling constant and the storage magnetoelastic coupling constant is in the range between −1000 ppm and 1000 ppm.

6. The magnetic sensor device according to claim 1, wherein the stress inducing device comprises an electrically conductive strip comprising a metal and/or an insulating material adapted for inducing the stress-induced anisotropic mechanical stress.

7. The magnetic sensor device according to claim 6, wherein the strength and the direction of the anisotropic stress is adjustable by adjusting at least one of: the nature of the material and the deposition conditions of the metal line and/or oxide forming the stress-inducing device, or the shape of the metal line.

8. The magnetic sensor device according to claim 6, wherein the strength and the direction of the anisotropic stress is adjustable by selecting a combination of materials having different thermal expansion coefficient for the metal and/or oxide forming stress-inducing device.

9. The magnetic sensor device according to claim 1, wherein the anisotropic mechanical stress applied by the stress inducing device is between about 1 MPa to 5 GPa.

10. The magnetic sensor device according to claim 1, comprising:

a plurality of branches, each branch comprising a subset of a plurality of MLU cells, each subset being electrically connected in series by a current line configured for passing a sense current adapted for sensing an average resistance of the subset corresponding to an average orientation of the sense magnetization in each of said plurality of MLU cells, in response to the external magnetic field;

wherein the stress inducing device is configured for inducing the stress-induced magnetic anisotropy on at least one of the sense layer and the storage layer of each MLU cell of the subset, for each of said plurality of branches.

11. The magnetic sensor device according to claim 10, wherein each subset being in magnetic communication with a programming line arranged for passing a field current inducing a programming magnetic field adapted for aligning the storage magnetization of the MLU cells comprised in the subset in a programmed direction.

12. The magnetic sensor device according to claim 10, wherein the stress inducing device is further configured such that the direction of the induced magnetic anisotropy is different for each of said plurality of branches.

13. A method for programming a magnetic sensor device comprising a plurality of magnetic logic unit MLU cells, each MLU cell comprising a magnetic tunnel junction including a sense layer having a sense magnetization freely orientable in the external magnetic field, a storage layer having a storage magnetization, a tunnel barrier layer between the sense layer and the storage layer and a stress inducing device configured for applying an anisotropic mechanical stress on the magnetic tunnel junction such as to induce a stress-induced magnetic anisotropy in the sense layer and the storage layer;

wherein said stress-induced magnetic anisotropy corresponds substantially to a net magnetic anisotropy of the sense layer and the storage layer; and wherein the stress inducing device is further configured such that the applied anisotropic mechanical stress induces the stress-induced magnetic anisotropy in the sense and storage layers, such that a direction of the sense stress-induced magnetic anisotropy of the sense layer differs from a direction of the storage stress-induced magnetic anisotropy of the storage layer;

the method comprising:

using the stress inducing device for inducing a stress-induced magnetic anisotropy on the sense layer and the storage layer such that a direction of the sense stress-induced magnetic anisotropy of the sense layer differs from a direction of the storage stress-induced magnetic anisotropy of the storage layer; and aligning the storage magnetization of each of said plurality of MLU cells in a programmed direction.

14. The method according to claim 13, wherein said aligning the storage magnetization is performed for each branch for the MLU cells comprised in each subset.

* * * * *

UNITED STATES PATENT AND TRADEMARK OFFICE
CERTIFICATE OF CORRECTION

PATENT NO. : 9,995,798 B2
APPLICATION NO. : 15/543614
DATED : June 12, 2018
INVENTOR(S) : Sebastien Bandiera Page 1 of 1

It is certified that error appears in the above-identified patent and that said Letters Patent is hereby corrected as shown below:

On the Title Page

Under the item (*) Notice: please delete the duplicate word "days." at the end of the section.

In the Specification

Column 9, Line 25: please remove the symbol "$||_1$" and replace it with -- $\lambda_1$ --.

Under the REFERENCE NUMBERS AND SYMBOLS section:

Column 11, Line 14: please add the numeral -- 3 -- before the word "current".

Signed and Sealed this
Eighteenth Day of September, 2018

Andrei Iancu
*Director of the United States Patent and Trademark Office*